(12) United States Patent
Iwazaki

(10) Patent No.: US 6,504,857 B1
(45) Date of Patent: Jan. 7, 2003

(54) LASER DIODE DETERIORATION DETECTING DEVICE

(75) Inventor: Shoji Iwazaki, Tokyo (JP)

(73) Assignee: Pentax Corporation, Tokyo (JP)

( * ) Notice: Subject to any disclaimer, the term of this patent is extended or adjusted under 35 U.S.C. 154(b) by 257 days.

(21) Appl. No.: 09/612,503

(22) Filed: Jul. 7, 2000

(30) Foreign Application Priority Data

Jul. 9, 1999 (JP) ........................................... 11-195218

(51) Int. Cl.$^7$ ................................................ H01S 3/00
(52) U.S. Cl. ................................. 372/38.1; 372/38.02
(58) Field of Search ......................... 372/38.1, 38.02, 372/38.07

(56) References Cited

U.S. PATENT DOCUMENTS

| | | | | |
|---|---|---|---|---|
| 4,807,239 A | * | 2/1989 | Takano et al. | 372/38.03 |
| 5,260,956 A | * | 11/1993 | Inaba et al. | 372/38.07 |
| 5,477,557 A | * | 12/1995 | Inaba et al. | 372/38.02 |

FOREIGN PATENT DOCUMENTS

JP    8-4163    1/1996

* cited by examiner

Primary Examiner—Paul Ip
Assistant Examiner—Jeffrey N Zahn
(74) Attorney, Agent, or Firm—Greenblum & Bernstein, P.L.C.

(57) ABSTRACT

A laser beam emitting device includes a laser diode, a drive current supply circuit, a laser power detection circuit, a first differential amplifier that outputs a first differential signal corresponding to a difference between the laser power detection signal and a reference value. A laser diode deterioration detection circuit includes a biasing circuit that modifies the laser power detection signal or the reference value upon issuance of deterioration detection command. A sample-hold circuit samples and holds the first differential signal just before the deterioration detection command is issued. A second differential amplifier outputs a second differential signal corresponding to a difference between the first differential signal after the deterioration detection command is issued and the signal held by said sample-hold circuit. A deterioration determining circuit compares the second differential signal and a deterioration detection reference value, and determines whether the laser diode is deteriorated based on the comparison result.

10 Claims, 5 Drawing Sheets

LASER DIODE DETERIORATION DETECTING DEVICE

BACKGROUND OF THE INVENTION

The present invention relates to a circuit for detecting deterioration of a laser diode, and particularly to a circuit that detects deterioration of the laser diode based on change of differential efficiency thereof.

In devices employing laser diodes as a light source, it is necessary to monitor operational status of the laser diodes and to detect deterioration thereof in order to ensure the operation of the devices. That is, if the laser diode is deteriorated, even if a predetermined current flows in the laser diode, the optical output power of the laser diode is lower than the designed value.

The main reasons why the laser diode is deteriorated are variation of semiconductor junctions with time, electrostatic destruction of the semiconductor structure, and the like.

A relationship of current to optical output of a laser diode is shown in FIG. 4A. In FIG. 4A, a curve S1 represents a characteristic of a normal (i.e., not deteriorated) laser diode, S2 and S3 represent characteristics of deteriorated ones. As shown in FIG. 4A, when the laser diode is deteriorated, the threshold Ith increases, and differential efficiency (i.e., a ratio of current to optical output power when the current is greater than the threshold Ith) decreases. It should be noted that for stimulated emission, the laser diode should be driven with the current greater than the threshold Ith. In FIG. 4A, thresholds for the characteristics S1–S3 are indicated by Ith(S1), Ith(S2) and Ith(S3), respectively.

The deterioration may be detected based on the threshold Ith. However, the threshold Ith varies depending on the temperature around the laser diode as shown in FIG. 4B. Therefore, the deterioration cannot be detected only by the value of the threshold Ith.

Accordingly, there has been suggested an LD (Laser Diode) deterioration detecting circuit based on differential efficiency thereof. As shown in FIG. 4B, although the threshold Ith varies depending on the temperature, the differential efficiency (i.e., $\Delta P/\Delta iL$) remains substantially the same regardless of the temperature. While, as shown in FIG. 4A, as the laser diode is deteriorated, the differential efficiency becomes lower. Therefore, based on the differential efficiency, the deterioration of the laser diode can be detected regardless of the temperature.

FIG. 5 shows a block diagram of an example of a conventional LD deterioration detection circuit. The circuit shown in FIG. 5 is a redrawing of a circuit disclosed in Japanese Patent Publication HEI8-4163. In this LD deterioration detection circuit, a laser beam emitted by a laser diode 201 is received by a photo diode 202, which generates a photocurrent ID corresponding to the intensity of the received laser beam. An I–V (current-to-voltage) converter 203 converts the photocurrent ID into a voltage VL, which is input to an inverted input terminal of a differential amplifier 204. The differential amplifier 204 outputs an amplified value of a difference between the voltage VL and a reference voltage VO generated by a reference voltage generator 205. The output of the differential amplifier 204 is input to a hold circuit 206, output of which controls a drive current supply circuit 207 to output a driving current IX for driving the laser diode 201.

When a deterioration detection command signal E is OFF (not issued), the circuit performs an APC (Automatic Power Control) process, and the current IX is controlled such that the voltage VL output by the I–V converter 203 is equal to the reference voltage VO.

When the detection command signal E is ON (issued), the circuit performs the detection of deterioration of the laser diode 201. That is, when the command signal E is ON, a switch 208 of the hold circuit 206 is switched such that the output of the differential amplifier 204 is not transmitted to the drive current supply circuit 207. The hold circuit 206 holds the output voltage of the differential amplifier 204 just before the switch 206 is turned OFF with a capacitor 213, thereby the driving current IX is maintained as a fixed value. Further, when the command signal E is ON, a switch 209 is switched so that a predetermined current $\Delta I$ from a biasing circuit 210 is added to the drive current IX and then supplied to the laser diode 201.

A deterioration determining circuit 211, which includes a comparison circuit and an inverting circuit, compares the voltage VL output by the I–V converter 203 with a deterioration detection reference voltage VT for determining whether the laser diode 201 is deteriorated. The comparison result of the deterioration determining circuit 211 and the command signal E are applied to an AND gate 212, which outputs a deterioration detection signal Sout.

In this conventional circuit, in accordance with the detection command E (when the command E is ON), the current $\Delta I$ from the biasing circuit 210 is added to the driving current IX, which flows in the laser diode 201, thereby output power of the laser diode 201 temporarily increases. The output photocurrent ID of the photo diode 202 increases, and accordingly, the output voltage VL of the I–V converter 203 also increases. The deterioration determining circuit 211 compares the output voltage VL with the reference voltage VT. If the voltage VL is greater than the reference voltage VT, it is determined that the differential efficiency of the laser diode 201 is greater than a predetermined value, and thus, the deterioration detection signal Sout will not be output. If the voltage VL is not greater than the deterioration detection voltage VT, it is detected that the differential efficiency has decreased, and therefore, the deterioration detecting signal Sout is output.

In the conventional LD deterioration detecting circuit as described above, the driving current IX is held by the hold circuit 206, and then a current $\Delta I$ from the biasing circuit 210 is added to the driving current IX. Then the sum of the current (IX+$\Delta I$) is supplied to the laser diode 201. Thus, the voltage VL corresponding to the current (IX+$\Delta I$) is output by the I–V converter 203, which voltage VL is compared with the reference voltage VT by the deterioration detecting circuit 211. If the optical output power of the laser beam is to be selectively set to one of a plurality of levels (either stepwise or continuously), it should be ensured that the optical output of the laser diode 201 is adjusted to correspond to the reference voltage VO, which is the reference voltage for examining the laser diode 201, before the deterioration detection command E is issued. Therefore, control is complicated.

Further, since the hold circuit 206 is connected in series with the APC circuit, when the deterioration detection is not performed, the sample-hold circuit 206 composed of the switch 208 and the capacitor 213 functions as a low-pass filter, which lowers a frequency characteristic of the APC. Specifically, the APC functions to maintain the optical output of the laser diode 201 to be predetermined quantity when it is driven. At the time when the laser diode 201 is started to be driven, or when the optical output is changed and then returned to the predetermined quantity, the frequency characteristic of the APC affects the response of the APC system. Generally, if the frequency characteristic becomes higher, the response of the APC system is improved.

Furthermore, since the deterioration detection circuit 211 continuously compares the voltage VL with the reference voltage VT, even if the detection command E is OFF, i.e., even when the bias current ΔI is not added to the drive current IX, if the voltage VL temporarily increases and exceeds the reference voltage VT, the detection signal Sout is issued. In order to avoid such a misdetection, the AND gate 212, which prevents output of the detection signal Sout when the detection command E is OFF, must be provided, and therefore the circuit configuration is complicated.

SUMMARY OF THE INVENTION

It is therefore an object of the present invention to provide an improved deterioration detection circuit for a laser diode, which is capable of detecting deterioration regardless of the output power of the laser diode before a detection command is issued, which does not affect the frequency characteristic of the APC circuit, and which has a relatively simple configuration.

For the above object, according to the present invention, there is provided a laser diode deterioration detection circuit for a laser beam emitting device employing a laser diode. The laser beam emitting device includes a drive current supply circuit that supplies a driving current to the laser diode, a laser power detection circuit that detects an optical output power of the laser diode and outputs a laser power detection signal representing the detected optical output power, a first differential amplifier that outputs a first differential signal corresponding to a difference between the laser power detection signal and a reference value, the drive current supply circuit varying the driving current based on the output of the first differential amplifier. The laser diode deterioration detection circuit includes a biasing circuit that modifies the laser power detection signal or the reference value upon issuance of deterioration detection command, a sample-hold circuit that samples and holds a value of the first differential signal output by the first differential amplifier before the deterioration detection command is issued, a second differential amplifier that outputs a second differential signal corresponding to a difference between the first differential signal after the deterioration detection command is issued and the value held by the sample-hold circuit, and a deterioration determining circuit that compares the second differential signal and a deterioration detection reference value, the deterioration determining circuit determining whether the laser diode is deteriorated based on the comparison result.

Optionally, the biasing circuit includes a signal source that generates a predetermined modifying signal to be applied to the laser power detection signal or the reference value, an operating element that add/subtract the predetermined modifying signal to/from the output detection signal or the reference value, and a first switch that connects the signal source when the deterioration detection command is issued.

Further optionally, the laser diode deterioration detection circuit may include a second switch that normally connects the sample-hold circuit with an output terminal of the first differential amplifier, the second switch disconnects the sample-hold circuit from the output terminal of the first differential amplifier when the deterioration detection command is issued.

Still optionally, the deterioration detection reference value is determined based on the modifying signal and a differential efficiency characteristic of the laser diode.

Furthermore, the sample-hold circuit, the second differential amplifier and the deterioration determining circuit can be arranged at least out of an automatic power control (APC) loop for maintaining the output power of the laser diode at a predetermined level, the APC loop including the drive current supply circuit, the laser power detection circuit and the first differential amplifier.

With this configuration, part of the circuit which contributes only to the detection of deterioration of the laser diode does not affect the APC performance.

BRIEF DESCRIPTION OF THE ACCOMPANYING DRAWINGS

DESCRIPTION OF THE EMBODIMENTS

Deterioration detection circuits for a laser diode according to embodiments of the present invention will be described with reference to the accompanying drawings.

Figure 1:
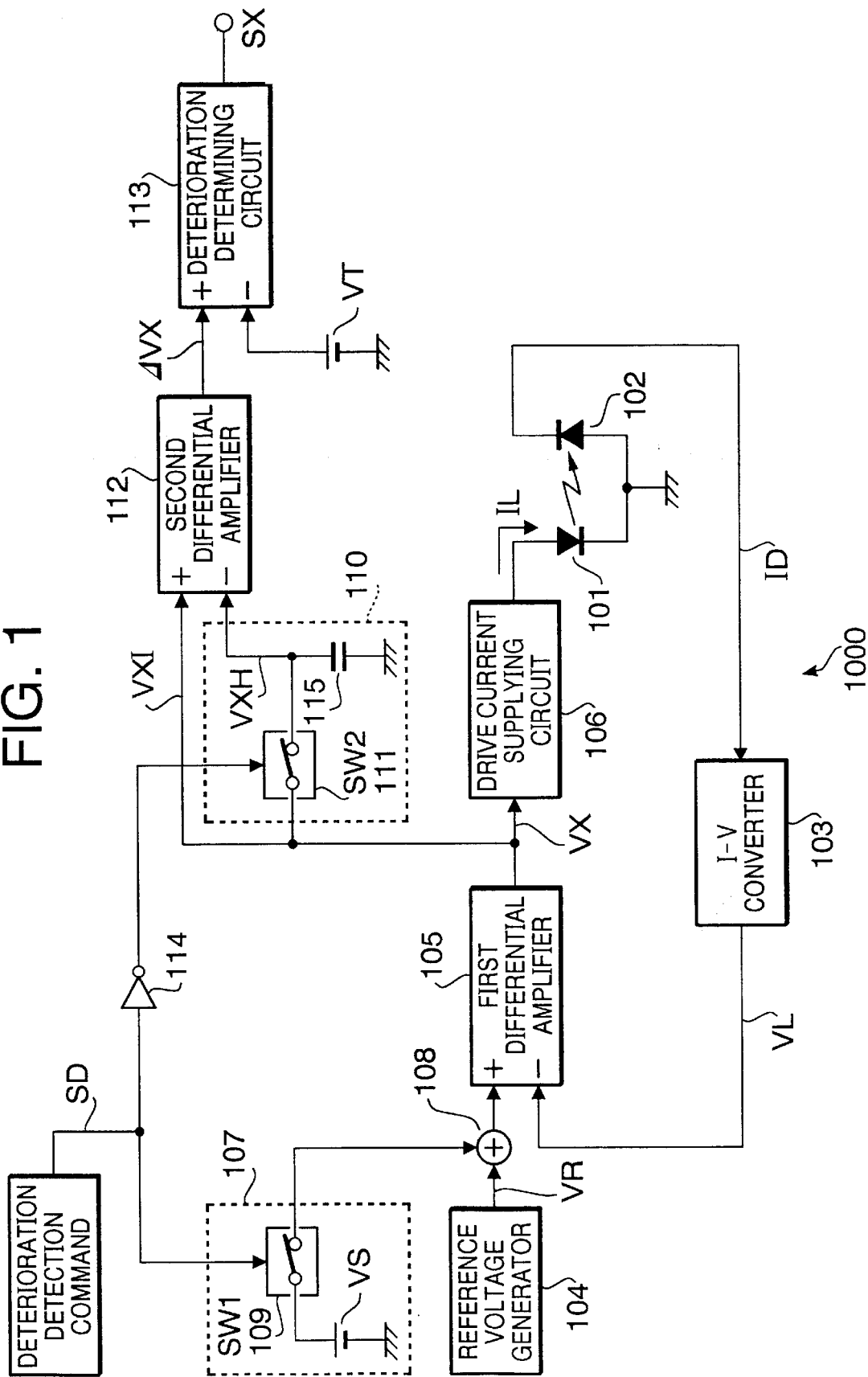
FIG. 1 is a block diagram of a deterioration detection circuit according to a first embodiment of the invention.

FIG. 1 is a block diagram of a deterioration detection circuit 1000 according to a first embodiment of the invention. The deterioration detection circuit 1000 includes an APC circuit for maintaining the optical output power of a laser diode 101 at a constant value.

Specifically, the deterioration detection circuit 1000 includes:

the laser diode 101;

a photo diode 102 for receiving a laser beam emitted by the laser diode 101 and output a photocurrent ID corresponding to the intensity of the received laser beam;

an I–V (current-to-voltage) converting circuit 103 for converting the output photocurrent ID into a voltage VL;

a first differential amplifier 105 that outputs an amplified voltage VX corresponding to a difference between the voltage VL and a reference voltage VR that is generated by a reference level generating circuit 104; and a drive current supplying circuit 106 that outputs a drive current IL for driving the laser diode 101 based on the voltage VX output by the first differential amplifier 105.

In the APC circuit (i.e., the deterioration detection circuit including the APC circuit) 1000, a difference between the voltage VL corresponding to the photocurrent ID generated by the photo diode 102 and the reference voltage VR is amplified (i.e., the voltage VX). Then, based on the voltage VX, an electrical current IL is supplied to the laser diode 101 by the drive current supply circuit 106. With this configuration, the electrical current IL can be controlled so that the voltage VL is equal to the reference voltage VR.

Further to the above configuration for the APC, the deterioration detection circuit 1000 is further provided with:

a bias source circuit 107 including a bias voltage source , and a first switch 109 for turning ON/OFF (i.e., connecting/disconnecting) the voltage supply from the bias voltage source;

an adder 108 for adding the output voltage VS of the bias voltage source to the reference voltage VR;

a sample-hold circuit 110 including a hold condenser 115 for holding the voltage VX output by the first differential amplifier 105 and a second switch 111 for turning ON/OFF (i.e., connecting/disconnecting) the output voltage VX from the first differential amplifier 105 to the hold condenser 115;

a second differential amplifier 112 for outputting a differential voltage ΔVX representing a difference between the voltage VXH held by the sample-hold circuit 110 and the output voltage VX of the first differential amplifier 105; and a deterioration determining circuit 113 which compares the output voltage ΔVX of the second differential amplifier 112 with a deterioration detection reference voltage VT used as a threshold for determining whether the laser diode 101 is deteriorated. The output signal of the deterioration determining circuit 113 is referred to as an LD deterioration detection signal SX.

Figure 4A:
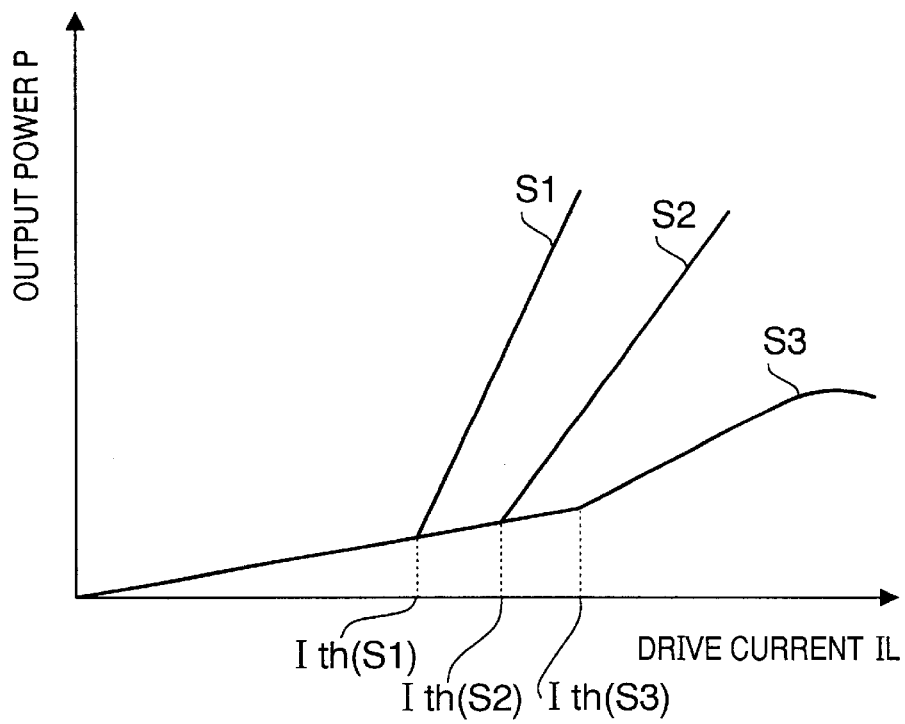
FIGS. 4A and 4B show graphs illustrating relationship of current to optical output of a laser diode.
Figure 4B:
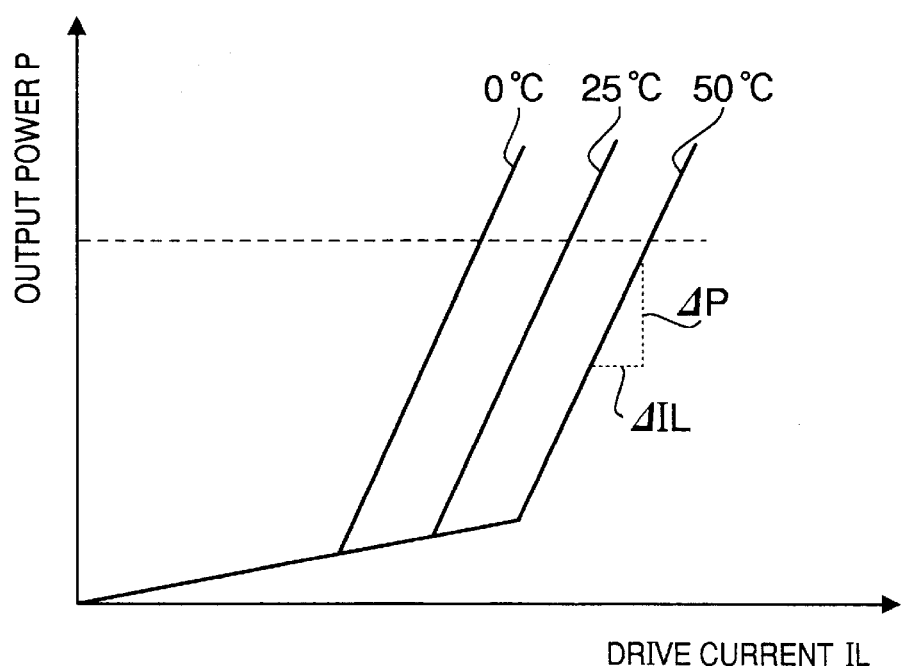
Figure 5:
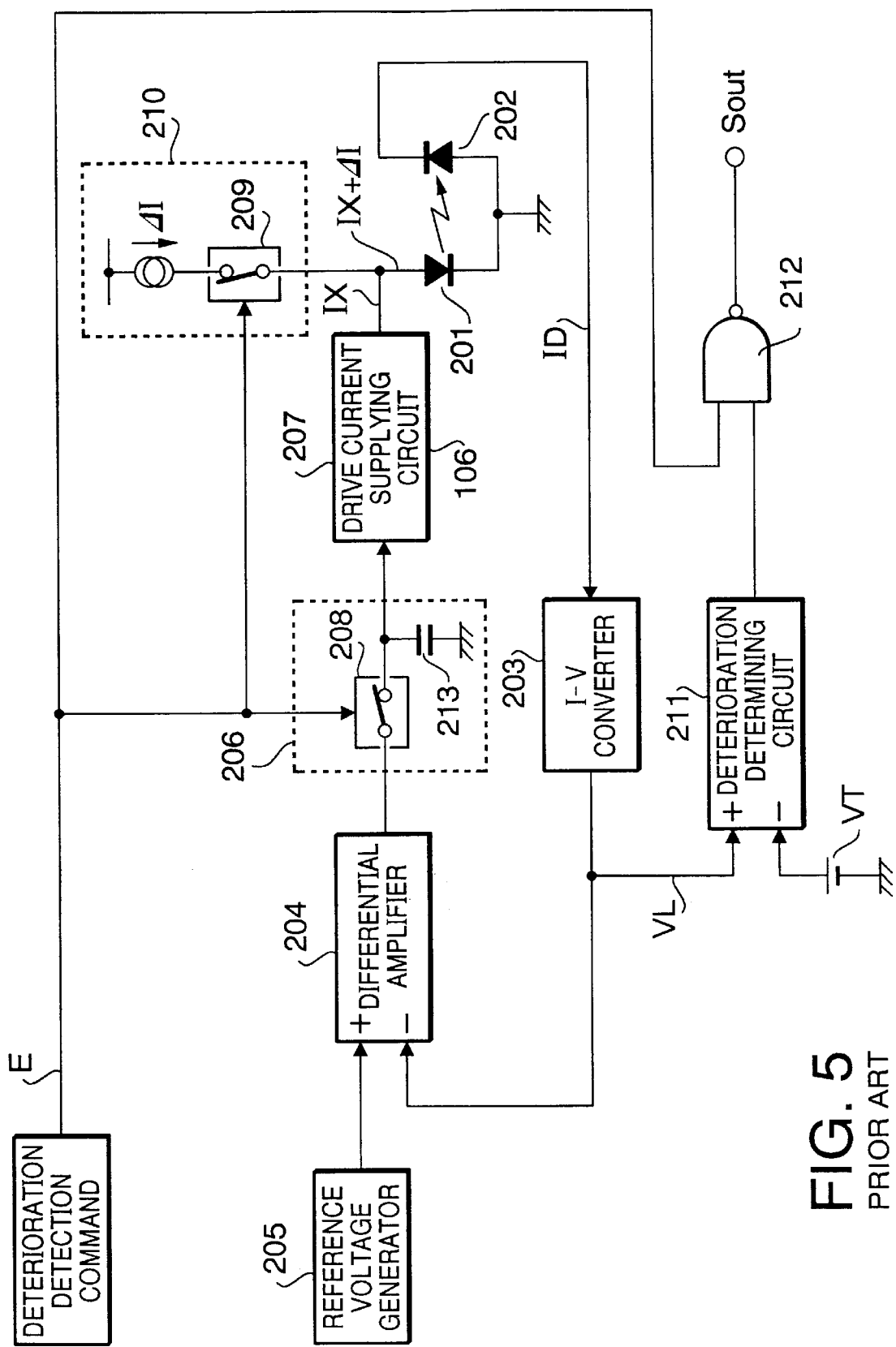
FIG. 5 shows a block diagram of a conventional deterioration detection circuit.

It should be noted that the deterioration detection reference voltage VT is determined based on the deteriorated differential efficiency of a laser diode (see FIG. 4A) and the bias voltage VS. Specifically, the differential efficiency η of the laser diode 101 is expressed as $$\eta = \Delta P / \Delta IL.$$

where, ΔP represents a variation of the optical output power of the laser diode 101 corresponding to the bias voltage VS, and ΔIL represents a variation of the drive current corresponding to the variation of the optical output power. Therefore, the voltage VT corresponds to the variation ΔIL of the drive current which is caused by the bias voltage VS, and a judgment value of the deteriorated differential efficiency.

To the first and second switches 109 and 111, the deterioration detection command SD and an inverted command ~SD, which is inverted by an inverter 114 are applied, respectively. The first switch 109 is turned ON (i.e., connects the bias source circuit 107 with the adder 108) when the deterioration detection command SD is ON (issued), while the second switch 111 is turned OFF (i.e., disconnects the first differential amplifier 105 from the sample-hold circuit 110) when the deterioration detection command SD is ON (issued).

Figure 2:
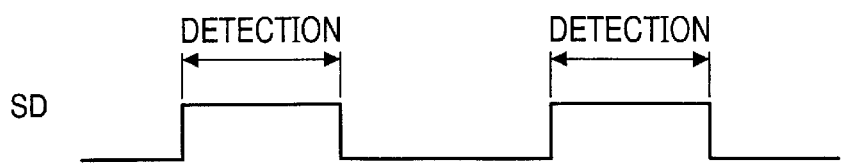
FIGS. 2A–2E show a timing chart illustrating operation of the deterioration detection circuit shown in FIG. 1.
Figure 2:
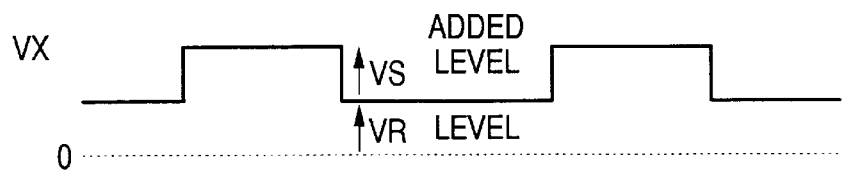
Figure 2:
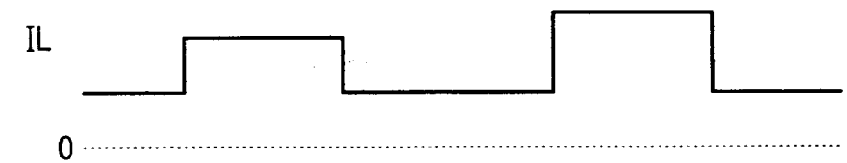
Figure 2:
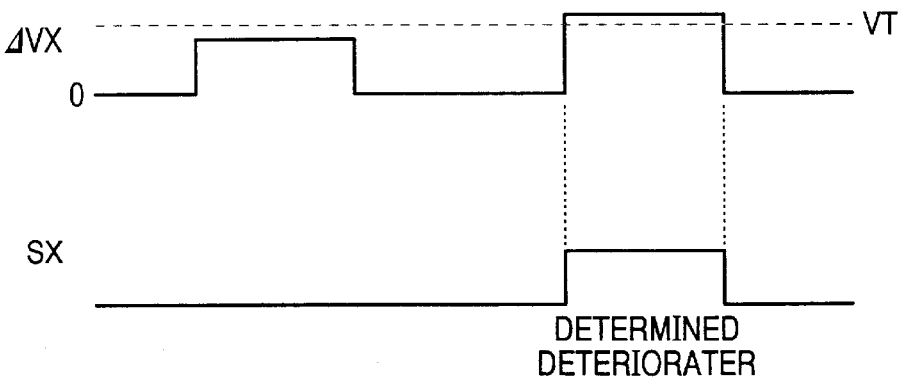

An operation of the LD deterioration detection circuit 1000 according to the first embodiment will be described with reference to a timing chart shown in FIGS. 2A–2E (FIG. 2).

When the deterioration detection command signal SD has not been issued, the first switch 109 is OFF and the second switch 111 is ON. Therefore, the APC operation is executed. At this stage, the output voltage VX of the first differential amplifier 105 is continuously sampled by the sample-hold circuit 110, thereby the output voltage VXH equals the voltage VX, which is input to the inverted input terminal of the second differential amplifier 112. At the same time, the drive voltage VX output by the first differential amplifier 105 is input to the non-inverted input terminal of the second differential amplifier 112. Accordingly, the differential voltage ΔVX output by the second differential amplifier 112 is zero. Since the output voltage ΔVX of the second differential amplifier 112 is smaller than the deterioration detection reference voltage VT, the deterioration determining circuit 113 does not output the deterioration detection signal SX.

When the deterioration detection command signal SD is input, the first switch 109 is turned ON, and the output voltage VS of the bias source circuit 107 is added to the reference voltage VR of the reference voltage generating circuit 104. Then, the APC circuit performs the APC operation in accordance with thus set new reference voltage (VR+VS). As a result of the APC operation, the output voltage VX of the first differential amplifier 105 increases, thereby the drive current IL supplied by the drive current supply circuit 106 increases, and therefore, the optical output power of the laser beam emitted by the laser diode 101 increases. The laser beam is received by the photo diode 102, then the I–V converter 103 outputs the voltage VL. Since the APC operation is effected, the drive current of the laser diode 101 is controlled such that the output voltage VL of the I–V converter 103 coincides with the new reference voltage (VR+VS).

Further, when the deterioration detection command signal SD is issued, the second switch 111 is turned OFF. Then, the sample-hold circuit 110 holds the drive voltage VX when the command signal SD is issued as the voltage VXH, which is input to the inverted input terminal of the second differential amplifier. To the non-inverted input terminal of the second differential amplifier 112, the output voltage VX1 of the first differential amplifier 105, which corresponds to the new reference voltage (VR+VS), is applied. Then, the second differential amplifier outputs a differential voltage ΔVX which is a difference between the voltages VXH and VX1. The deterioration determining circuit 113 compares the output voltage ΔVX with the deterioration detection reference voltage VT. If the voltage ΔVX is smaller than the reference voltage VT, the differential efficiency η of the laser diode 101 is determined to be normal and the deterioration detection signal SX will not be issued. If the voltage ΔVX is not smaller than the reference voltage VT, the differential efficiency η is determined to be lower than the judgment value of the deteriorated differential efficiency, and the deterioration detection signal SX is issued.

As described above, according to the deterioration detection circuit 1000, a deterioration detection operation can be performed regardless of the reference voltage referred to in the APC operation. That is, it is not necessary to set a reference voltage to a predetermined voltage (VO as in the conventional circuit) corresponding to the deterioration detection reference voltage VT. Therefore, a complicated control can be avoided, and the deterioration detection operation can be performed quickly.

Further, since the sample-hold circuit 110 is provide outside the APC circuit, the sample-hold circuit 110 does not lower the frequency characteristics of the APC.

Therefore, a high-speed APC circuit can be achieved.

Furthermore, when the deterioration detection command signal SD is not input, the same voltage is applied to the two input ports of the second differential amplifier 112. Therefore, even if the feed back voltage VL temporarily varies by great amount during the APC, the output of the second differential amplifier 112 is always zero, and the deterioration determining circuit 113 does not output the deterioration detection signal SX. Therefore, according to the first embodiment, the AND gate for control the deterioration detection signal is not necessary, and the configuration of the circuit is simplified.

Second Embodiment

Figure 3:
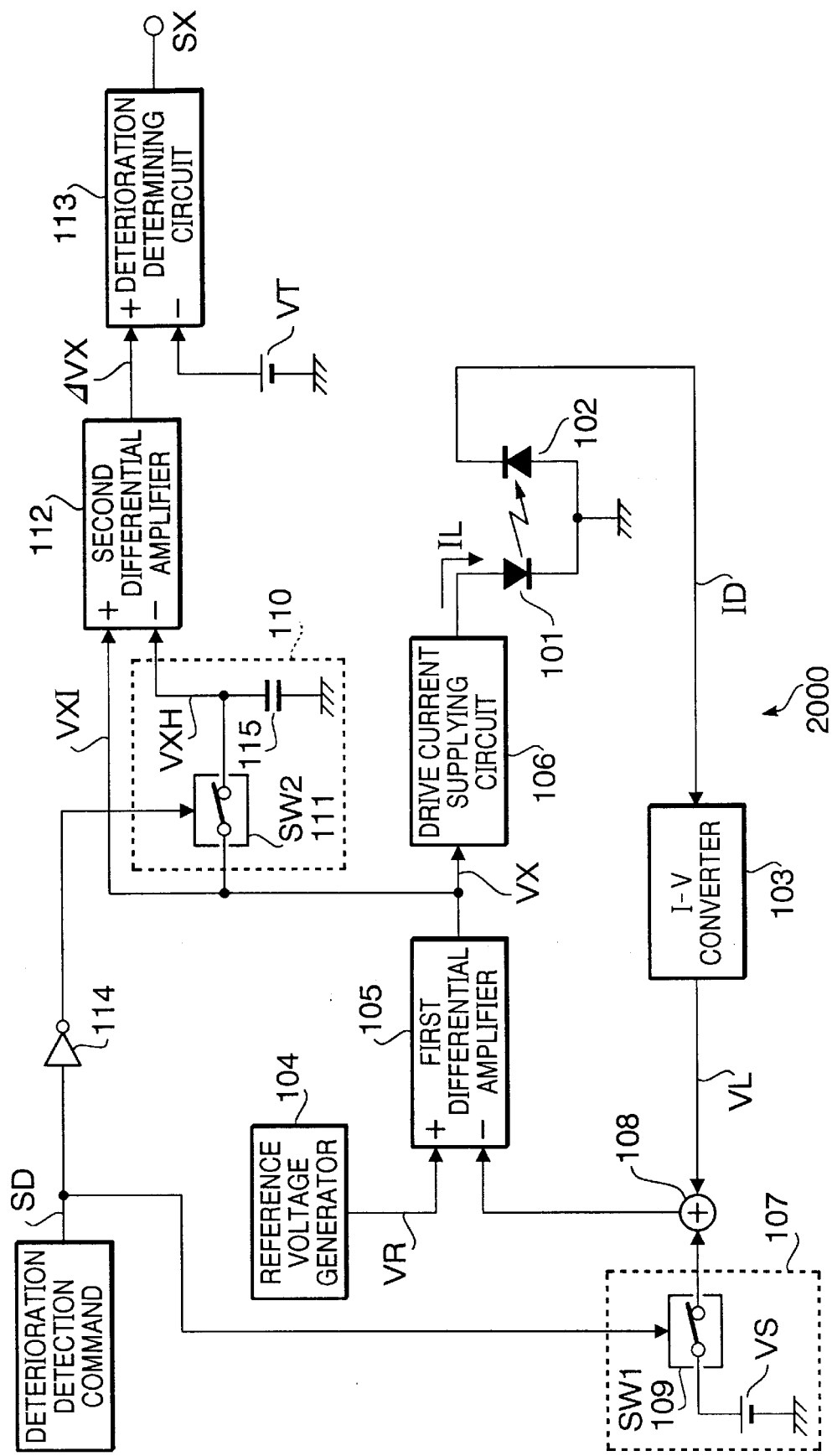
FIG. 3 is a block diagram of a deterioration detection circuit according to a second embodiment of the invention.

FIG. 3 is a block diagram of a deterioration detection circuit 2000 according to a second embodiment of the invention. In FIG. 3, elements similar to those employed in the first embodiment are assigned with the same reference numerals, and description thereof will be omitted.

In the second embodiment, the output voltage VL corresponding to the photocurrent ID generated by the photo diode 102 and the bias voltage VS output by the bias source circuit 107 are added. Then, the first differential amplifier 105 outputs an amplified difference VX of the added voltage (VL+VS) and the reference voltage VR. The output voltage VX of the second differential amplifier 105 is input to the sample-hold circuit 110. The voltage VXH held by the sample-hold circuit 110 is compared with the voltage VX by the second differential amplifier 112.

In the second embodiment, the output voltage VXH of the sample-hold circuit 110 is applied to the non-inverted input terminal of the second differential amplifier 112, and the output voltage VX of the first differential amplifier 105 is applied to the inverted input terminal of the second differential amplifier 112. With this configuration, similarly to the first embodiment, the output voltage ΔVX of the second differential amplifier 112 is compared with the deterioration detection reference voltage VT by the deterioration determining circuit 113. If the voltage ΔVX is smaller than the reference voltage VT, the differential efficiency η of the laser diode 101 is determined to be normal, and the deterioration detection signal SX will not be issued. If the voltage ΔVX is not smaller than the reference voltage VT, the differential efficiency η is determined to be lowered, and the deterioration detection signal SX is issued.

It should be noted that, in the first embodiment, the bias voltage VS is added to the reference voltage. However, the invention is not limited to such a configuration, and the bias voltage VS can be subtracted from the reference voltage. In this case, however, the second differential amplifier is configured as that in the second embodiment.

Similarly, in the second embodiment, the bias voltage VS is added to the voltage VL corresponding to the current ID generated by the photo diode 102. It can be modified such that the bias voltage VS is subtracted from the output voltage VL of the I–V converter 103. In this case, however, the second differential amplifier is configured as that in the first embodiment.

As described above, according to the invention, when the deterioration detection command signal is issued, the reference level for the APC operation is changed (shifted) (first embodiment) or the voltage corresponding to the current generated by the photo diode is changed (shifted) (second embodiment). Then, the difference of the output voltages of the first differential amplifier before and after the deterioration detection signal is issued is obtained with the second differential amplifier. Thus obtained difference is compared with the deterioration detection reference voltage to determine whether the laser diode is deteriorated.

Since it is not necessary to bring the reference voltage to a predetermined value before the deterioration detection is performed, the circuit can be simplified, and a quick detection can be made. Further, when the deterioration detection command signal is not issued, the deterioration determining signal will not be output, and therefore, an AND gate for control the deterioration detection signal can be avoided. This also simplifies the configuration of the deterioration detection circuit. Furthermore, since the sample-hold circuit is arranged out of the APC circuit, when the deterioration detection is not performed, the operation of the APC circuit is not affected by the operation of the deterioration detection circuit, and therefore a high-speed APC operation can be achieved.

The present disclosure relates to the subject matter contained in Japanese Patent Application No. HEI 11-195218, filed on Jul. 9, 1999, which is expressly incorporated herein by reference in its entirety.

What is claimed is:

1. A laser diode deterioration detection circuit for a laser beam emitting device employing a laser diode, the laser beam emitting device including a drive current supply circuit that supplies a driving current to said laser diode, a laser power detection circuit that detects an optical output power of said laser diode and outputs a laser power detection signal representing the detected optical output power, a first differential amplifier that outputs a first differential signal corresponding to a difference between the laser power detection signal and a reference value, said drive current supply circuit varying the driving current based on the output of said first differential amplifier, said laser diode deterioration detection circuit comprising:

a biasing circuit that modifies the laser power detection signal upon issuance of a deterioration detection command;

a sample-hold circuit that samples and holds a value of the first differential signal output by said first differential amplifier before the deterioration detection command is issued;

a second differential amplifier that outputs a second differential signal corresponding to a difference between said first differential signal after the deterioration detection command is issued and the value held by said sample-hold circuit; and a deterioration determining circuit that compares the second differential signal and a deterioration detection reference value, said deterioration determining circuit determining whether the laser diode is deteriorated based on the comparison result.

2. The laser diode deterioration detection circuit according to claim 1, wherein said biasing circuit includes:

a signal source that generates a predetermined modifying signal to be applied to the laser power detection signal;

an operating element that one of adds said predetermined modifying signal to the laser power detection signal and subtracts said predetermined modifying signal from said laser power detection signal; and a first switch that connects said operating element with said signal source when said deterioration detection command is issued.

3. The laser diode deterioration detection circuit according to claim 1, further including a second switch that normally connects said sample-hold circuit with an output terminal of said first differential amplifier, said second switch disconnects said sample-hold circuit from said output terminal of said first differential amplifier when said deterioration detection command is issued.

4. The laser diode deterioration detection circuit according to claim 2, wherein said deterioration detection reference value is determined based on the predetermined modifying signal and a differential efficiency characteristic of said laser diode.

5. The laser diode deterioration detection circuit according to claim 1, wherein said sample-hold circuit, said second differential amplifier and said deterioration determining circuit are arranged at least out of an automatic power control (APC) loop for maintaining the output power of said laser diode at a predetermined level, said APC loop including said drive current supply circuit, said laser power detection circuit and said first differential amplifier.

6. A laser diode deterioration detection circuit for a laser beam emitting device employing a laser diode, the laser beam emitting device including a drive current supply circuit that supplies a driving current to said laser diode, a laser power detection circuit that detects an optical output power of said laser diode and outputs a laser power detection signal representing the detected optical output power, a first differential amplifier that outputs a first differential signal corresponding to a difference between the laser power detection signal and a reference value, said drive current supply circuit varying the driving current based on the output of said first differential amplifier, said laser diode deterioration detection circuit comprising:

a biasing circuit that modifies the reference value upon issuance of a deterioration detection command;

a sample-hold circuit that samples and holds a value of the first differential signal output by said first differential amplifier before the deterioration detection command is issued;

a second differential amplifier that outputs a second differential signal corresponding to a difference between said first differential signal after the deterioration detection command is issued and the value held by said sample-hold circuit; and a deterioration determining circuit that compares the second differential signal and a deterioration detection reference value, said deterioration determining circuit determining whether the laser diode is deteriorated based on the comparison result.

7. The laser diode deterioration detection circuit according to claim 6, wherein said biasing circuit includes:

a signal source that generates a predetermined modifying signal to be applied to the reference value;

an operating element that one of adds said predetermined modifying signal to the reference value and subtracts said predetermined modifying signal from the reference value; and a first switch that connects said operating element with said signal source when said deterioration detection command is issued.

8. The laser diode deterioration detection circuit according to claim 6, further including a second switch that normally connects said sample-hold circuit with an output terminal of said first differential amplifier, said second switch disconnects said sample-hold circuit from said output terminal of said first differential amplifier when said deterioration detection command is issued.

9. The laser diode deterioration detection circuit according to claim 7, wherein said deterioration detection reference value is determined based on the predetermined modifying signal and a differential efficiency characteristic of said laser diode.

10. The laser diode deterioration detection circuit according to claim 6, wherein said sample-hold circuit, said second differential amplifier and said deterioration determining circuit are arranged at least out of an automatic power control (APC) loop for maintaining the output power of said laser diode at a predetermined level, said APC loop including said drive current supply circuit, said laser power detection circuit and said first differential amplifier.

* * * * *